United States Patent [19]
Rinne

[11] Patent Number: 5,990,472
[45] Date of Patent: Nov. 23, 1999

[54] MICROELECTRONIC RADIATION DETECTORS FOR DETECTING AND EMITTING RADIATION SIGNALS

[75] Inventor: Glenn A. Rinne, Cary, N.C.

[73] Assignee: MCNC, Research Triangle Park, N.C.

[21] Appl. No.: 08/940,000

[22] Filed: Sep. 29, 1997

[51] Int. Cl.[6] .............................. H01L 31/12; H01L 23/48
[52] U.S. Cl. ........................ 250/214.1; 250/551; 257/723
[58] Field of Search ............................ 250/214.1, 239, 250/551; 327/514; 257/433, 685, 686, 723, 724

[56] References Cited

U.S. PATENT DOCUMENTS

| | | | |
|---|---|---|---|
| 3,501,681 | 3/1970 | Weir | 317/234 |
| 3,663,184 | 5/1972 | Wood et al. | 29/195 |
| 3,760,238 | 9/1973 | Hamer et al. | 317/234 R |
| 3,770,874 | 11/1973 | Krieger et al. | 174/68.5 |
| 3,871,014 | 3/1975 | King et al. | 357/67 |
| 3,942,187 | 3/1976 | Gelsing et al. | 357/71 |
| 4,113,578 | 9/1978 | Del Monte | 204/15 |
| 4,711,998 | 12/1987 | Malek | 250/203 R |
| 4,769,531 | 9/1988 | Malek | 250/203 R |
| 4,948,754 | 8/1990 | Kondo et al. | 437/183 |
| 4,950,623 | 8/1990 | Dishon | 437/183 |
| 4,962,058 | 10/1990 | Cronin et al. | 437/187 |
| 5,030,828 | 7/1991 | Solomon | 250/338.4 |
| 5,072,105 | 12/1991 | Osawa | 250/206.1 |
| 5,113,314 | 5/1992 | Wheeler et al. | 361/384 |
| 5,160,409 | 11/1992 | Moore et al. | 156/656 |
| 5,162,257 | 11/1992 | Yung | 437/183 |
| 5,194,137 | 3/1993 | Moore et al. | 205/125 |
| 5,196,689 | 3/1993 | Sugita et al. | 250/206.1 |
| 5,227,632 | 7/1993 | Armstrong et al. | 250/221 |
| 5,243,179 | 9/1993 | Bjorkman | 250/206.2 |
| 5,250,843 | 10/1993 | Eichelberger | 257/692 |
| 5,283,551 | 2/1994 | Guscott | 340/567 |
| 5,293,006 | 3/1994 | Yung | 174/261 |
| 5,300,778 | 4/1994 | Norkus et al. | 250/339.01 |
| 5,327,013 | 7/1994 | Moore et al. | 257/772 |
| 5,347,428 | 9/1994 | Carson et al. | 361/760 |
| 5,354,711 | 10/1994 | Heitzmann et al. | 437/182 |
| 5,406,701 | 4/1995 | Pepe et al. | 29/840 |
| 5,424,920 | 6/1995 | Miyake | 361/735 |
| 5,428,215 | 6/1995 | Dubois et al. | 250/206.2 |
| 5,432,729 | 7/1995 | Carson et al. | 365/63 |
| 5,440,116 | 8/1995 | Bolander et al. | 250/216 |
| 5,453,582 | 9/1995 | Amano et al. | 174/261 |
| 5,583,058 | 12/1996 | Utsumi et al. | 437/3 |
| 5,585,633 | 12/1996 | Tulet | 250/338.3 |
| 5,604,695 | 2/1997 | Cantin et al. | 356/121 |
| 5,793,116 | 8/1998 | Rinne et al. | 257/723 |
| 5,828,074 | 10/1998 | Pearlman | 250/551 |

FOREIGN PATENT DOCUMENTS

| | | |
|---|---|---|
| 2 688 628 | 9/1993 | France . |
| 55-111127 | 8/1980 | Japan . |
| 57-73952 | 5/1982 | Japan . |
| 57-197838 | 12/1982 | Japan . |
| 59-154041 | 9/1984 | Japan . |
| 6-116552 | 1/1986 | Japan . |
| 63-222445 | 9/1988 | Japan . |
| 4-150033 | 5/1992 | Japan . |

OTHER PUBLICATIONS

J. Robert Lineback, "3D IC Packaging Moves Closer to Commercial Use," *Electronic World News*, p. 15, May 21, 1990.

Don Swanson, *Assembly Technology in China*, Electronics Packaging & Production, vol. 35, No. 1, Jan. 1995, pp. 40 and 42.

Howell et al., *Area Array Soldier Interconnection Technology for the Three–Dimensional Silicon Cube*, Published by IBM Microelectronics Divison, pp. 1174–1178.

Teh–Hua Ju et al., *An Integrated Model for Ball Grid Array Solder Joint Reliability*, Published by Department of Mechanical Engineering, University of Colorado, pp. 308–313.

*Primary Examiner*—Stephone Allen
*Attorney, Agent, or Firm*—Alston & Bird LLP

[57] ABSTRACT

A radiation detector includes a microelectronic frustum structure that defines an inner cavity and is mounted to a base structure such as a microelectronic substrate. In particular, at least two microelectronic sections or substrates are attached to one another to form the frustum structure. A radiation sensor can be fabricated on one or more of the sections. In addition, a radiation sensor can be mounted to the base so as to be concentrically aligned with the longitudinal axis of the cavity of the frustum structure. The substrates forming the frustum structure are preferably attached to one another using arched solder interconnects. The frustum structure may also be attached to the base using arched solder interconnects.

61 Claims, 11 Drawing Sheets

5,990,472

MICROELECTRONIC RADIATION DETECTORS FOR DETECTING AND EMITTING RADIATION SIGNALS

FIELD OF THE INVENTION

This invention generally relates to microelectronic devices and methods, and more particularly to microelectronic radiation detectors and methods for using same.

BACKGROUND OF THE INVENTION

The higher end of the electromagnetic frequency spectrum (e.g., 20 megahertz (MHz) to $4 \times 10^8$ MHz) has received a large amount of attention in recent years for use in a variety of applications in the fields of communications, sensors and imaging. This portion of the electromagnetic frequency spectrum includes radio frequency (RF) signals, microwave signals, infrared signals, and optical (i.e., laser) signals. Because of the lack of naturally existing sources of radiation within these frequency bands and the relatively recent development of the technology that can operate in this portion of the electromagnetic frequency spectrum, devices operating in these frequency ranges are desirable for a wide variety of applications, including military and commercial.

Devices that comprise detectors which operate in these frequency ranges can be used to, inter alia, determine the direction and range of incident radiation signals. For example, using relatively simple and well known formulations, two or more sensors can be used in combination to determine the incident angle (also referred to as bearing) of a received signal by comparing the relative signal strengths of the respective sensors. Further, two or more such paired detectors spaced apart at a known distance can be utilized to determine the range to the source of the signal by using the method of triangulation.

An example of an infrared radiation detector that may be able to determine the direction of a radiation signal is disclosed in U.S. Pat. No. 4,769,531 to Fritz J. Malek, entitled "Directional Finder System with Inclined Detectors" (hereinafter referred to as "Malek"). In Malek, four detectors are positioned about the Z axis so as to face the Z axis at an incline. An associated computer processes the received signals and computes a direction of the incident signals. However, systems such as the one disclosed in Malek are relatively large and are not self-aligning. Further, with specific regard to Malek, the detector configuration disclosed apparently requires a frame to support the radiation receiving surfaces which significantly increases the complexity, and therefore cost, of fabrication.

While current radiation detectors are useful for many applications, there are a vast number of applications in which miniaturized devices on the scale of microelectronic devices are desirable, if not required. In fact, there exists an ever present desire to miniaturize signaling devices in order to, among other things, reduce cost, reduce power consumption, and increase packaging density. Current microelectronic radiation devices are generally planar because of the necessity to fabricate these devices using known microfabrication techniques such as photolithography, masking, etching, etc. See, for example, U.S. Pat. No. 5,030,828 to Solomon, entitled "Recessed Element Photosensitive Detector Array with Optical Isolation" (hereinafter referred to as "Solomon"), and U.S. Pat. No. 5,583,058 to Utsumi et al., entitled "Infrared Detection Element Array and Method for Fabrication the Same" (hereinafter referred to as "Utsumi et al."). The devices disclosed in Solomon and Utsumi et al. are planar devices, and therefore, typically require a relative large detection device to attain sufficient angular resolution.

Thus, a heretofore unsatisfied need exists in the industry for a microelectronic radiation detector that is sized on the scale of microelectronic devices and is capable of spatial detection.

SUMMARY OF THE INVENTION

It is therefore an object of the present invention to provide an improved microelectronic radiation detector.

It is another object of the present invention to provide a microelectronic radiation detector for direction and/or range detection of radiation sources.

It is another object of the present invention to provide a microelectronic radiation detector capable of being packaged in an array of detectors with a relatively small pitch.

These and other objects are provided in accordance with the present invention by a radiation detector comprising a microelectronic frustum structure that defines an inner cavity and that is mounted to a base structure. In particular, the frustum structure comprises at least three microelectronic sections or substrates that are preferably attached to one another using arched solder interconnects. The frustum structure may also be attached to the base using arched solder interconnects. A radiation sensor can be fabricated on one or more of the substrates. In addition, a radiation sensor can be mounted to the base so as to be concentrically aligned with the longitudinal axis of the cavity defined by the frustum structure. Accordingly, a radiation detector in accordance with the present invention has many advantageous applications in military and commercial signaling devices because of its miniature size and relatively low cost.

In accordance with a first aspect of the present invention, a microelectronic radiation detector comprises a multi-surface structure including at least a first microelectronic substrate, a second microelectronic substrate and a third microelectronic substrate. Each substrate is connected to an adjacent microelectronic substrate so as to define a cavity including a first aperture having a first opening of a first area and a second aperture having a second opening of a second area, and wherein the first area is smaller than said second area. The microelectronic structure further includes a base to which the multi-surface structure is mounted proximate the first aperture, and a radiation sensor on a surface of at least one of the microelectronic substrates. It will be appreciated that the radiation detector can be fabricated on an inside surface or an outside surface of the microelectronic substrate.

The microelectronic substrates are preferably interconnected by arched solder interconnects. The microelectronic substrates can be interconnected in a manner such that an edge of at least one of the microelectronic substrates is connected to another one of the microelectronic substrates. In addition, an edge of each of the microelectronic substrates can be connected to a corresponding edge of an adjacent microelectronic substrate. The microelectronic substrates can have a trapezoidal shape. The microelectronic substrates can also be substantially equal in corresponding edge lengths. The inside surfaces of the microelectronic substrates can be generally planar, or alternatively, the inside surfaces can be generally curved.

The microelectronic structure also can include means for moving the base to selectively orient the multi-surface structure. The microelectronic structure can also comprise a radiation sensor mounted on the base proximate the first aperture of the multi-surface structure. Further, the microelectronic structure can be connected to the base by arched solder interconnects.

The multi-surface structure can comprises a fourth microelectronic substrate having at least two opposing edges, and wherein the fourth microelectronic substrate is connected at the two opposing edges with two of the first, second and third microelectronic substrates. It will be appreciated that by incorporating more and more microelectronic substrates, one or more sides of the microelectronic structure can take on a circular or arcuate shape which may be desirable in certain applications.

In accordance with a second aspect of the present invention, a microelectronic radiation detector comprises a frustum structure including at least a first microelectronic substrate, a second microelectronic substrate and a third microelectronic substrate forming the sides thereof and defining a longitudinal opening therethrough. The microelectronic radiation detector also can include a radiation sensor on an inside surface and/or outside surface of at least one of the microelectronic substrates. The frustum structure can define a first opening opposite a second opening, wherein the first opening has a smaller area than the second opening. The microelectronic radiation detector can further comprise a base to which the frustum structure is mounted at either the first opening or the second opening. The microelectronic radiation detector can further comprise means for moving the base to selectively orient the frustum structure. The frustum structure is preferably connected to the base by arched solder interconnects. Further, the microelectronic substrates also are preferably interconnected by arched solder interconnects.

The microelectronic radiation detector can further include a second radiation sensor mounted on the base. The second radiation sensor can be concentrically aligned with the longitudinal opening of the frustum structure. The frustum structure can include a fourth microelectronic substrate interconnected at opposing edges with two of the first, second and third microelectronic substrates. Again, by further increasing the number of microelectronic substrates, the frustum structure may take on a frusta-conical shape which may be desirable in certain applications.

In accordance with a third aspect of the present invention, a microelectronic radiation detector comprises a frustum structure including at least a first microelectronic substrate, a second microelectronic substrate and a third microelectronic substrate forming respective sides of the frustum structure and defining a longitudinal cavity therethrough. The frustum structure defines a first opening opposite a second opening, wherein the first opening has a smaller area than the second opening. The microelectronic radiation detector can include a base to which the frustum structure is mounted at either the first opening or the second opening. A radiation sensor can be mounted on the base and concentrically aligned with the central axis of the longitudinal cavity of the frustum structure. In addition, a second radiation sensor can be mounted on an inside surface or an outside surface of at least one of the microelectronic substrates.

The frustum structure can be connected to the base by arched solder interconnects. In addition, the microelectronic substrates can be interconnected by arched solder interconnects.

In accordance with a fourth aspect of the present invention, a method for determining an incident angle of a radiation signal utilizing a microelectronic frustum structure in accordance with the present invention comprises the step of generating a first signal based on the radiation signal received at a first radiation sensor located on the base while the microelectronic frustum structure is in a first position. The base is moved to a second position to orient the microelectronic frustum structure in another direction, and a second signal is generated based on the radiation signal received at the first radiation sensor while the microelectronic frustum structure is in the second position. The first and second signals are compared to determine which of the first and second positions is in closer alignment with the incident angle of the radiation signal.

The above method can include the further steps of generating a third signal based on the radiation signal received at a second radiation detector located on an inside surface of one of the substrates comprising the microelectronic frustum structure while the microelectronic frustum structure is in the first position, and combining the first and third signals to determine the incident angle of the radiation signal. Further, the method also can include the steps of generating a fourth signal based on the radiation signal received at a third radiation sensor located on another of the substrates comprising the microelectronic frustum structure, and combining the fourth, first and third signals to determine the incident angle of the radiation signal.

In the fifth aspect of the present invention, a method for determining an incident angle of a radiation signal utilizing a microelectronic structure that forms a cavity having a side portion and a base portion comprises the step of generating a first signal based on a first radiation signal received at a first radiation sensor located on the base portion while the microelectronic structure is in a first position. The microelectronic structure is moved to a second position to orient the microelectronic structure in another direction, and a second signal is generated based on a second radiation signal received at the first radiation sensor while the microelectronic structure is in the second position. The first and second signals are compared to determine which of the first and second positions is in closer alignment with the incident angle of the radiation signal.

In the fifth aspect of the present invention, the step of generating the first signal can include the step of receiving the first radiation signal in a concave base portion. Further steps can include generating a third signal based on a third radiation signal received at a second radiation sensor located on an inside surface of the side portion of the microelectronic structure while the microelectronic structure is in the first position, and combining the first and third signals to determine the incident angle of the radiation signal. The step of generating the third signal can include the step of receiving the third radiation signal in a annular side portion.

The method of the fifth aspect of the present invention can include the steps of generating a fourth signal based on the radiation signal received at a third radiation sensor located on the inside surface of the side portion of the microelectronic structure, and combining the fourth signal with the first and third signals to determine the incident angle of the radiation signal.

In accordance with a sixth aspect of the present invention, a method of fabricating a microelectronic radiation detector comprises the steps of interconnecting adjacent edges of a plurality of microelectronic substrates via arched solder interconnects to form a frustum structure defming a cavity having first and second openings, and mounting the frustum structure to a base. A radiation detector can be mounted to the base at the first opening or the second of the frustum structure. The frustum structure can be mounted to the base utilizing arched solder interconnects. In addition, the cavity of the frustum structure can be filled with an inert material. The inert material can be formed into a convex lens or a convex lens.

In the sixth aspect of the present invention, the step of interconnecting the edges of the microelectronic substrates can include the step of forming arched solder interconnects on the outside surfaces of the microelectronic substrates, on the inside surfaces of the microelectronic substrates, or on both the outside and inside surfaces of the microelectronic substrates.

DETAILED DESCRIPTION OF PREFERRED EMBODIMENTS

Figure 1:
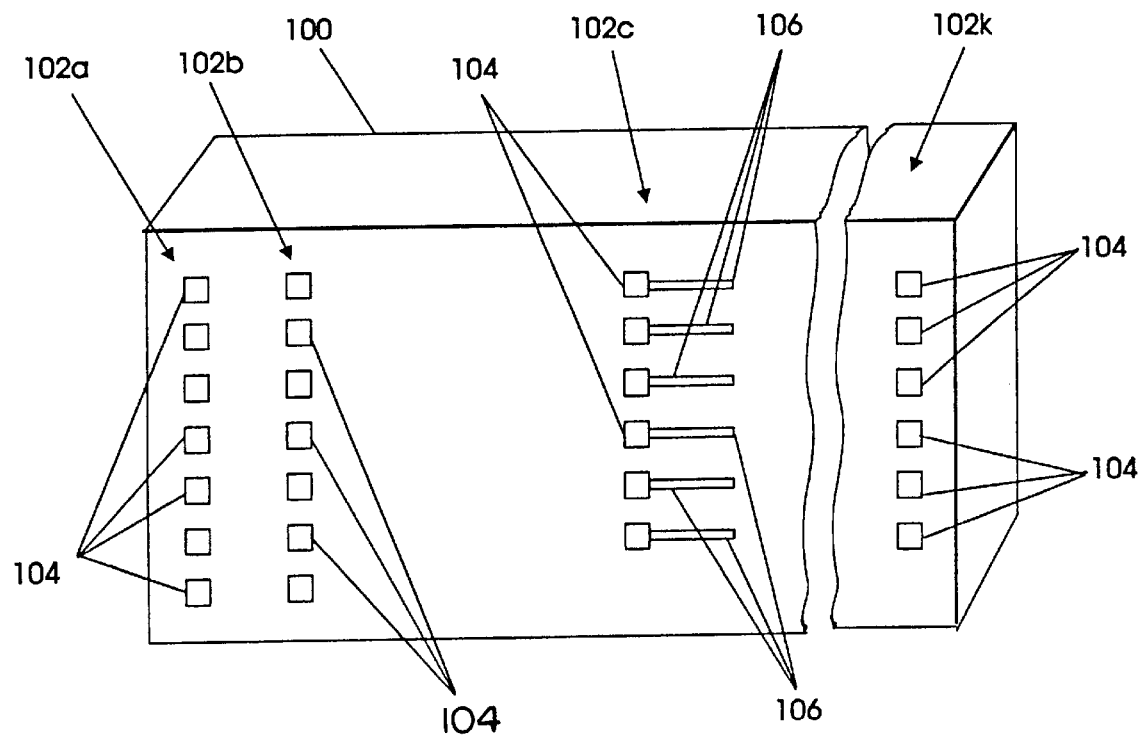
FIGS. 1 and 2 illustrates a perspective view of a first microelectronic substrate and a second microelectronic substrate, respectively, which can be attached using an arched solder interconnect technique in according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and are not drawn to scale. Like numbers refer to like elements throughout.

The present invention comprises a microelectronic radiation detector that is durable in construction, reliable in operation, and diverse in application. A microelectronic radiation detector in accordance with the present invention can be a single multispectral device, or can be fabricated in a array of detectors having different wavelength sensitivity to provide spectral characterization (e.g., color imaging). For purposes of this disclosure, the present invention is described as being fabricated using arched solder interconnects, though it will be understood that other techniques may be used to form a microelectronic structure in accordance with the present invention, such as wire bonding, clips, or flex substrates. In an initial discussion below, arched solder interconnect technology is described. Following that discussion, various embodiments of a microelectronic radiation detector in accordance with the present invention are described. Lastly, a discussion of a method of operation of a microelectronic radiation detector in accordance with the present invention is provided.

I. Arched Solder Interconnects

Figure 2:
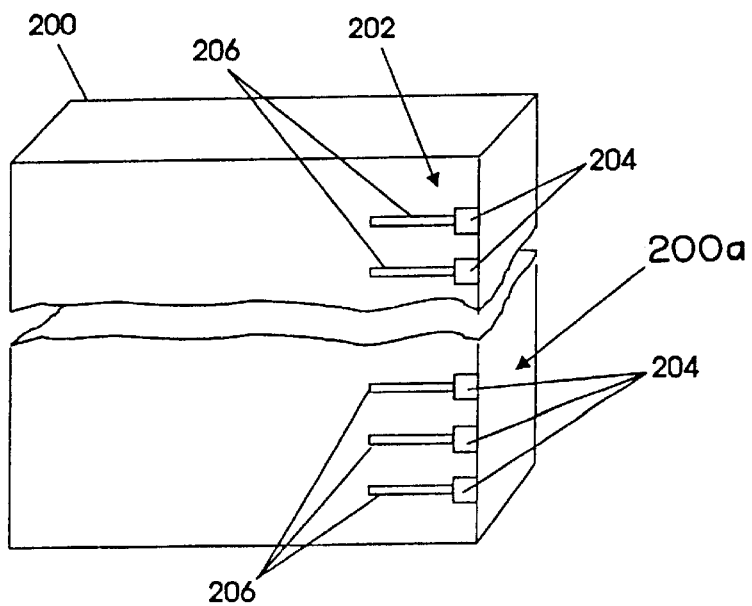

The arched solder interconnect technique described below provides for an excellent electrical signal transmission path as well as mechanical support, as will be evident upon reading the following description. A more detailed discussion of arched solder interconnects can be found in co-pending application Ser. No. 08/654,539, filed May 29, 1996, entitled "Microelectronic Packaging Using Arched Solder Columns", and assigned to the assignee of the present invention, the disclosure of which is incorporated herein by reference as if set forth in full. This technique may be used for all of the radiation detectors described herein. Referring to FIGS. 1 and 2, first and second microelectronic substrates which can be used to form a microelectronic radiation detector according to the present invention are illustrated. FIG. 1 illustrates a perspective view of a first microelectronic substrate 100. While the microelectronic substrates discussed herein are substantially planar, it will be understood that curved substrates may be utilized. The substrate 100 includes a plurality of rows 102a–102k of pads 104. As shown in FIG. 1, the rows 102a–102k may have different numbers and sizes of pads 104 and may be spaced at various locations on first substrate 100. Although square pads are illustrated, they can take any shape. Rows of pads may also be included on the back face of substrate 100, or on one or more edges of the substrate (not shown). Some adjacent pairs of rows, such as rows 102c and 102k may be used to contact separate substrates. Other adjacent pairs of rows, such as rows 102a and 102b may be used to contact the front and back faces of a single substrate.

The first microelectronic substrate 100 may be an integrated circuit chip, a printed circuit board, a multi-layer ceramic substrate, or any other substrate which is used in microelectronics. The fabrication of pads on microelectronic substrates is well known to those having skill in the art and need not be described further herein.

FIG. 2 illustrates a perspective view of a second microelectronic substrate 200. As shown in FIG. 2, the second microelectronic substrate 200 includes a row 202 of pads 204 adjacent and extending along an edge 200a of the second substrate 200. These pads preferably have a spacing which corresponds to the spacing of at least one row of pads 102 in the first microelectronic substrate 100. It will be understood that the pad pitches need not be identical, because one substrate can be mounted on another substrate at an angle, so that one pad pitch may be less than the other pitch. Similar to the first microelectronic substrate 100, the second microelectronic substrate 200 may be any type of substrate used in microelectronic systems.

As will be described below, the microelectronic substrate 200 can be mounted on substrate 100 by forming solder structures, preferably arched solder columns, between the pads 104 in a row on the first substrate 100 and the pads 204 in the row on the second substrate 200. The first and second rows of the pads 104 may include elongated pad extensions which are narrower than the pads 104. Thus, as shown in FIG. 1, row 102c includes a plurality of elongated pad extensions 106, which are narrower than the pads. A respective one of the elongated pad extensions 106 is connected to a respective pad 104 in the row of pads 102c. Similarly, in FIG. 2, each pad 204 includes an elongated pad extension 206 which is narrower than the pads. A respective pad extension 206 is connected to a respective pad 204. The pad extensions 106, 206, and also preferably the pads 104, 204, include a layer of solder thereon.

Figure 3A:
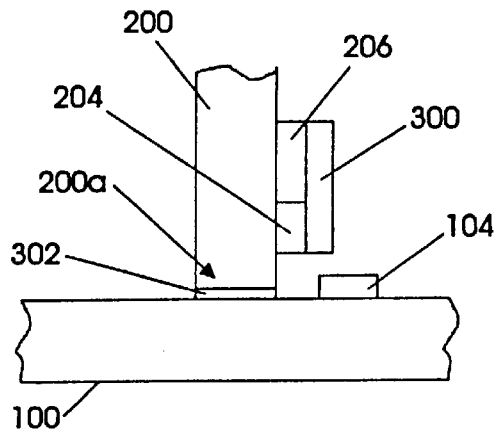
FIGS. 3A–3D are cross-sectional views of intermediate fabrication steps of the microelectronic substrates of FIGS. 1 and 2 being interconnected in according to the arched solder interconnect technique of the present invention.

FIGS. 3A–3D are cross-sectional views of a microelectronic arched solder interconnect as may be used for the present invention, using substrates 100 and 200, during intermediate fabrication steps. As shown in FIG. 3A, the first microelectronic substrate 100 is oriented in nonparallel relationship to the second microelectronic substrate 200, such that the edge 200a of the second microelectronic substrate 200 is adjacent the first microelectronic substrate 100. The first microelectronic substrate includes a first row of pads 104, for example, row 102k of FIG. 1, and the second microelectronic substrate 200 includes a second row 202 of pads 204 adjacent and extending along the edge 200a of the second microelectronic substrate 200. It will also be understood that three or more substrates, having three or more rows of pads, may be oriented together for bonding.

As also shown in FIG. 3A, one of the first and second rows of pads includes a plurality of elongated pad extensions 206. It will be understood by those having skill in the art that pad extensions may be formed on first substrate 100, second substrate 200, or both, depending upon the particular geometries of the pads, the volumes of solder bumps which are to be formed, and other fabrication parameters. As also shown in FIG. 3A, the elongated pad extension 206 and the associated row of pads 204 include solder 300 thereon. It will be understood that the pads and pad extensions may be formed of exposed portions of a larger layer which is patterned by a mask.

FIG. 3A illustrates the second microelectronic substrate 200 oriented orthogonal to the first microelectronic substrate 100. However, it will also be understood that the first and second microelectronic substrates can be oriented obliquely relative to one another, as discussed in detail below. FIG. 3A also illustrates a bonding layer 302 which may be used to secure the substrates to one another prior to solder attachment. The bonding layer may be flux or other common adhesives used in the microelectronic industry. Alternatively, a clamp or other fixture may be used to hold the substrates together in the absence of a bonding layer, or the force of gravity may hold them in place.

The formation of solder 300 on pads 204 and pad extensions 206 may be accomplished using many techniques. For example, a solder dam may be used to define the pads and/or pad extensions by exposing the pads and pad extensions in a larger solder wettable layer. Techniques for forming a solder layer on solder pads and extension regions are described in co-pending application Ser. No. 08/416,619 to Rinne et al., filed on Apr. 5, 1995, and entitled "Methods for Forming Integrated Redistribution Routing Conductors and Solder Bumps and Structures Formed Thereby", assigned to the assignee of the present application, the disclosure of which is hereby incorporated herein by reference as if set forth in full.

Figure 3B:
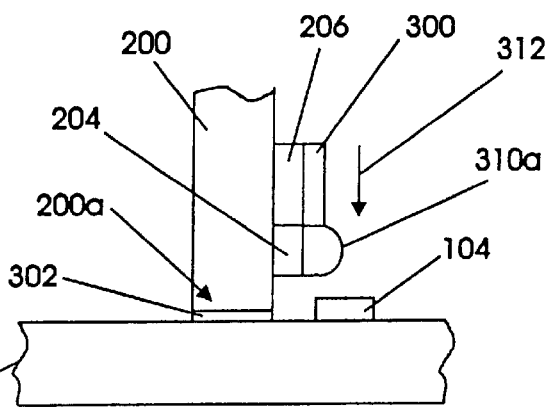
Figure 3C:
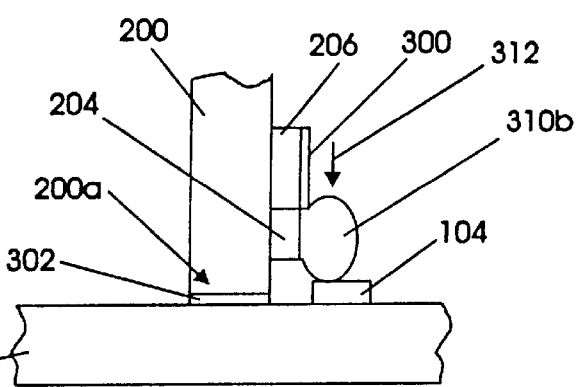
Figure 3D:
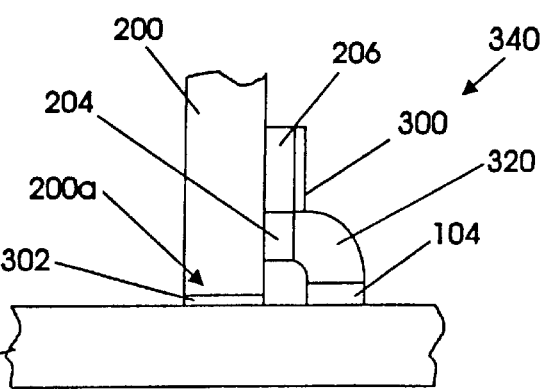

Referring now to FIGS. 3B, 3C and 3D, the solder 300 is reflowed. At first, as shown in FIG. 3B, a solder bump 310a forms on pad 204 as solder flows from over elongated pad extension 206 to over pad 204 in the direction shown by arrow 312. Solder flows from the elongated pad extension onto the respective pad due to the surface tension within the solder which causes the flowing solder to flow from the relatively thin extension to the relatively wide pad, as described in the aforesaid application, Ser. No. 08/416,619 to Rinne et al.

As shown in FIG. 3C, as the reflow continues, an expanding volume solder bump 310b forms as more and more of the solder flows from over elongated pad extension 206 to over the pad 204. As also shown in FIG. 3C, the reflow causes the expanding volume solder bump 310b to laterally expand beyond the edges of pad 204 of the second microelectronic substrate 200, and thereby contact the pad 104 on the first substrate 100.

Finally, referring to FIG. 3D, once the expanding solder bump contacts pad 104, the surface tension of the solder will create an arched solder column 320 which extends from the pad 204 on second substrate 200 to the pad 104 on the first substrate 100. The arched solder column 320 may be regarded as a partial ring, here a quarter ring, of solder. As will be understood, the arched solder column forms an excellent conductor for high frequency microelectronic signals. Particularly, the circular cross-section is an excellent geometry for electrical signal propagation and can provide a controlled transition for microwave and millimeter wave signals. The arched solder columns 320 can be used herein for both mechanical supports and electrical connections in fabricating a microelectronic radiation detector in accordance with the present invention.

Additional description of the arched solder interconnect method of FIGS. 3A–3D will now be provided. As illustrated in FIGS. 3A–3D, solder 300 is formed using a patterned plating template that defines regions that will have differing internal pressures in the molten solder during reflow. During reflow, the molten solder flows preferentially to the low pressure regions, thereby forming a large bump that extends past the edge of the substrate. The bump can wet the mating solder pad and form an arched solder column that provides electrical connection and/or mechanically supports the resultant microelectronic package.

The method of FIGS. 3A–3D describes forming a solder bump on substrate 200. It will also be understood that the solder bump may be formed on substrate 100 and may expand to contact a pad on substrate 200. In another alternative, solder bumps may be formed on both substrates, and may expand to contact one another, and thereby form the arched solder column 320. In yet another alternative, solder bumps may be formed on opposing surfaces of substrate 200 to form arched solder columns on both sides of substrate 200, and thus, provide greater mechanical strength and a greater number of electrical connections.

Figure 4:
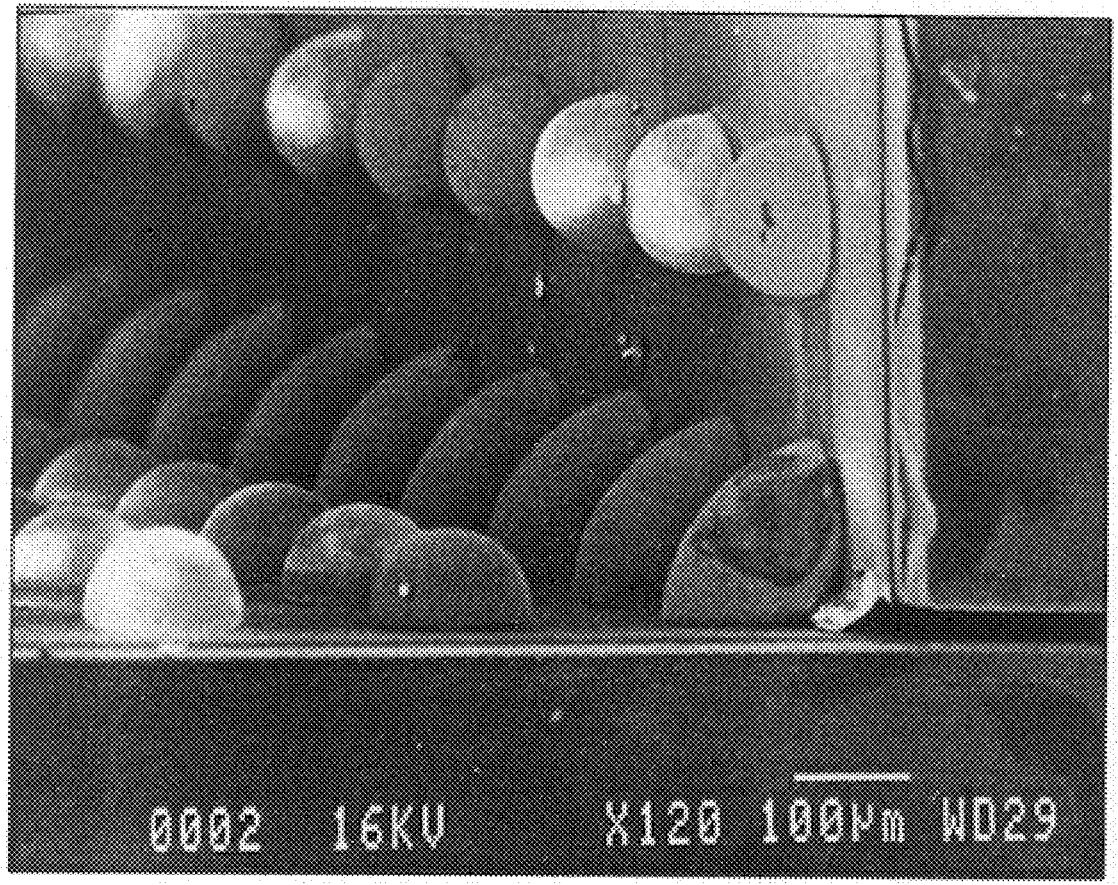
FIG. 4 is a scanning electron microscope photomicrograph of a microelectronic package according to the present invention.

The method illustrated in FIGS. 3A–3D has been demonstrated using a one centimeter square integrated circuit chip with 41–125 μm solder bumps on 250 μm centers along one edge. This chip was mounted perpendicular to a second chip. Prior to assembly, the first chip was coated with a bonding layer in the form of a rosin-based flux to provide enough tack to hold the chip in position during the reflow process. The vertical chip was aligned and placed by hand under a stereo microscope at 10× magnification. The assembly was then reflowed in a nitrogen inert infrared belt furnace. An SEM photomicrograph of the package including the arched solder columns is shown in FIG. 4. As shown in FIG. 4, the technique allows large solder bumps to form at the very edge of adjacent substrates such that corresponding bumps join to form arched solder columns.

Figure 5:
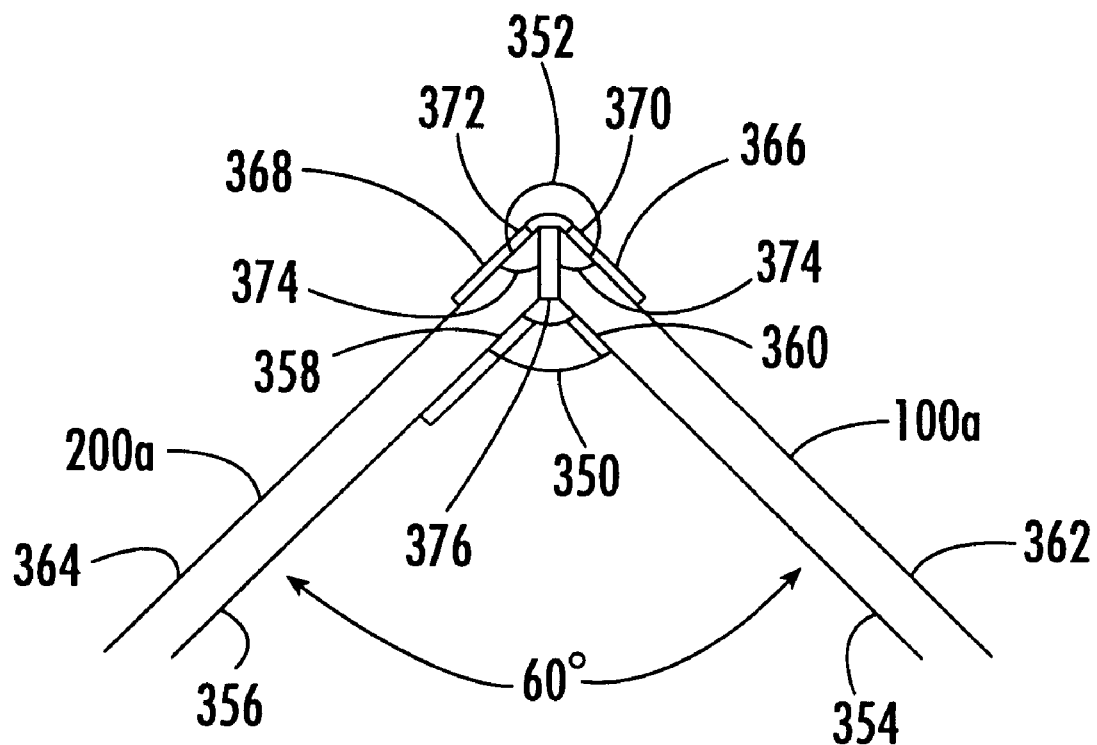
FIG. 5 is a cross-sectional view of two substrates connected at an oblique angle using the arched solder interconnect technique of the present invention.

In FIG. 5 illustrates a third microelectronic substrate 100a and a fourth microelectronic substrate 200a connected at an approximately 60° angle via arched solder columns 350, 352. The arched solder column 350 spans between the facing surfaces 354, 356 of substrates 100a, 200a, respectively. As discussed above, the reflow causes the expanding volume solder bump to become superhemispherical and laterally expand beyond the edge of the microelectronic substrate. Thus, an expanding volume solder bump on pad 358 of the fourth substrate 200a will contact a mating pad 360 of the third substrate 100a to form the arched solder column 350.

The arched solder column 352 spans between opposing surfaces 362, 364 of substrates 100a, 200a, respectively. When forming an arched solder column between surfaces that are separated by an angle greater than approximately 90°, then it is preferable to include an elongated pad extension 366, 368 with each pad 370, 372 to form an expanding volume solder bump on each surface. Therefore, the expanding volume solder bumps formed on the opposing surfaces will become superhemispherical and laterally expand beyond the edges of the respective substrate and contact one another and form the arch solder column 352.

It is further noted that corresponding edges 374 of the respective substrates 100a and 200a may be beveled to an appropriate angle so that edges 374 mate with one another in a substantially parallel relationship. The beveled edges 374 can be achieved by a number of different well known techniques, such as etching, polishing, or using a beveled blade when dicing a wafer into individual substrates. The substrates 100a and 200a can be secured to one another prior to reflow by a bonding layer 376, as described above, or alternatively, by a clamp or other fixture.

There are several advantages to providing arch solder interconnects on both side of the interface between microelectronic substrates 100a and 200a. For instance, the additional arched solder columns provide more mechanical support to the structure. Further, the additional arched solder columns provide more electrical connections.

The solder bumps may be formed on a variety of surfaces, allowing a great variety of options for both the vertical and horizontal components of the assembly. Solder bumps may be deposited on silicon, alumina, aluminum nitride and quartz. It is also possible to use diamond, ferrite, copper and other materials. When used with eutectic PbSn or other low melting point solders, organic substrates such as FR-4, BT resin, polyimide and flex circuits also may be used and may offer advantages in cost or flexibility.

It will be understood that because the connections are made at the edge of a substrate, applications may be limited to substrates which have relatively low input/output requirements. However, solder connections on pitches as small as 0.050 mm may be presently made for a connection density of 200 connections per centimeter. If connections are made at each edge of a one centimeter by one centimeter substrate, 800 connections may be provided for the substrate.

II. Radiation Detector Configurations

Figure 6:
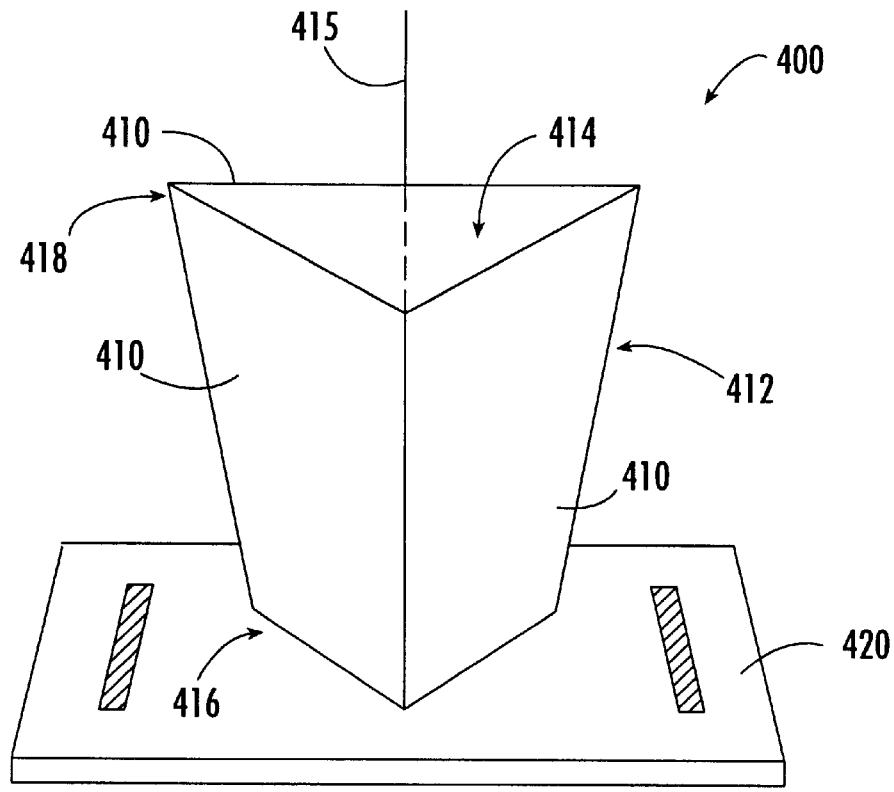
FIG. 6 is a perspective view of a microelectronic radiation detector in accordance with an embodiment of the present invention, wherein the microelectronic radiation detector includes three microelectronic substrates.

Referring now to FIG. 6, a radiation detector 400 in accordance with a first embodiment of the present invention is shown. The radiation detector 400 comprises three substantially identical microelectronic substrates 410 which are interconnected to form a frustum structure 412. The frustum structure 412 defines a cavity 414 having a first opening 416 of a first area and a second opening 418 of a second area, wherein the first area is less than the second area. The cavity 414 has a longitudinal central axis 415. The frustum structure is mounted to a base 420 at the first opening 416. However, it will be understood that the frustum structure 412 also can be mounted to the base 420 at the second opening 418.

Figure 7:
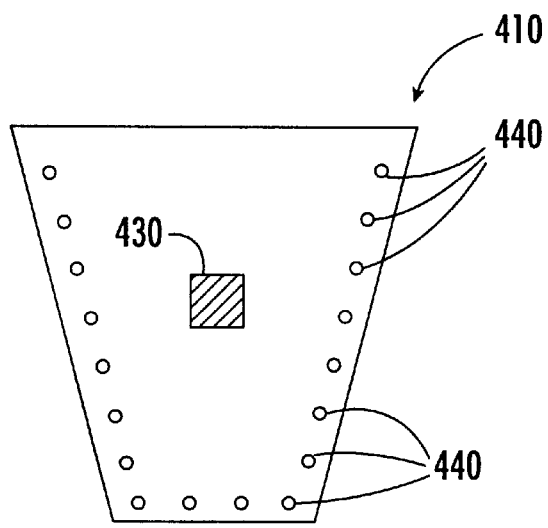
FIG. 7 is an elevational view of a surface of a microelectronic substrate that, for example, can be utilized to fabricate a microelectronic radiation detector such as the one of FIG. 6.
Figure 8:
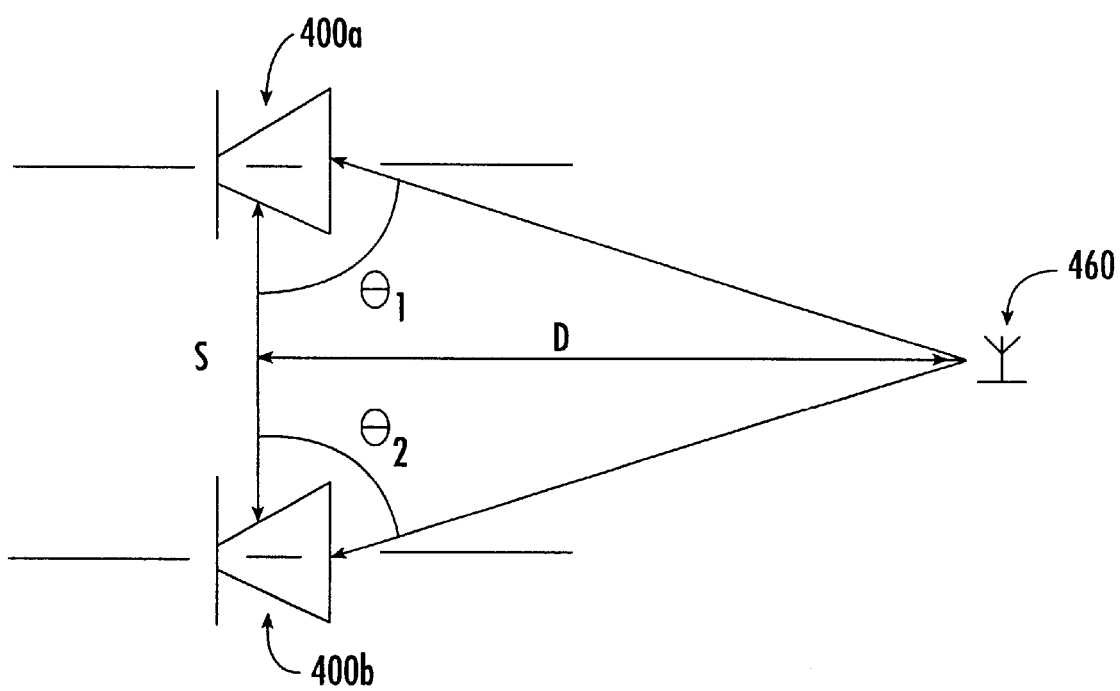
FIG. 8 is a schematic illustration of range detection using microelectronic radiation detectors in accordance with the present invention.

The microelectronic substrates 410 which comprise the frustum structure 412 have a trapezoidal shape and may include a radiation sensor 430 formed at their respective centers, as shown in FIG. 7. For purposes of this disclosure, the radiation sensors 430 may be a sensing device, an emitting device, or both. The radiation sensor 430 can be, but is not limited to, a photodiode, microwave antenna, micromachined thermopile or bolometer, or any suitable electromagnetic radiation or acoustic sensor. The fabrication of sensors on a microelectronic substrate is well known to those having skill in the art, and therefore, need not be explained further herein. The radiation detector 430 can be mounted to either the inside surface or the outside surface of the substrate 410, though it is generally preferred that the radiation sensors 430 be fabricated on the same side of the solder bumps 440, as shown.

Placing the radiation detectors 430 on the outside surface of a substrate 410 may be advantageous in an application of the radiation detector 400 in a frequency response band in which the substrates 410 is transparent to the incident signal. Therefore, the radiation sensors 430 can be mounted to the outside surfaces of the substrates in such cases without any noticeable degradation of signal-to-noise ratio. As an example, it is noted that silicon is transparent to signals in the infrared band.

Though the radiation sensor 430 is substantially centered on the microelectronic substrate 410 in FIG. 7, it will be understood that the radiation detector 430 does not have to be centered but can be positioned off-center. In fact, it may be desirable to tile several radiation detectors of various wavelength sensitivity on the microelectronic substrate 410 for spectral characterization (e.g., color imaging).

The solder bumps 440 are provided for mechanically and/or electrically connecting adjacent microelectronic substrates 410. Particularly, the solder bumps 440 are disposed along opposing edges and along the edge adjacent to the base 420. By positioning the three substrates 410 in place using simple fixtures that support the substrates at the appropriate angles, the microelectronic substrates 410 can be connected at their respective edges to adjacent substrates 410 and to the base 420 in a reflow step. In accordance with arched solder column technology described above, the surface tension of the solder comprising the solder bumps 440 will cause the substrates 410 to align themselves with respect to one another; that is, the microelectronic radiation detector 400 is self-aligning. This is particularly advantageous in the fabrication of microelectronic devices because of the difficulty in providing the exact alignment in the assembly process prior to the reflow step. Post assembly calibration can also correct for any residual misalignment.

Referring back to FIG. 6, a discrete circuit component 450 can be fabricated on the base 420 and electrically connected to a radiation sensor 430 via one or more of the arched solder interconnects. Thus, the circuitry necessary for sensor excitation and response measurement can be fabricated directly on the base 420, which is preferably a silicon substrate. The discrete circuit component 450 may comprise microprocessors, controllers, memory devices, drivers or other conventional microelectronic circuits. The base 420 also can be made to move in one or more planes of movement to form an aiming device that can track a radiation source. In this configuration, the microelectronic radiation detector 400 can be moved until the signal received at the respective radiation sensors 430 are substantially equal so that the radiation detector 400 is essentially pointing at the radiation source.

By incorporating at least one radiation sensor 430 on each of the microelectronic substrates 410, a three-axis detector is formed which can be used for determining the bearing (ie., direction) of an incident radiation signal. The bearing of the incident radiation signal can be determined using the relative illumination of the respective sensors 430 as is well known. In addition, two microelectronic radiation detectors 400 which are separated by a known distance can be used to determine the distance or range to a source of an incident signal. As shown in FIG. 7, the distance from the center point between the two sensors 400*a*, 400*b* to the radiation source 460 can be calculated using Equation (1) below:

$$D=S(1/(\tan\theta_1)+1/(\tan\theta_2))^{-1} \qquad (1)$$

where S is the distance between the two detectors 400*a* and 400*b*, D is the distance to the radiation source, $\theta_1$ is the incident angle at the detector 400*a*, and $\theta_2$ is the incident angle at the detector 400*b*.

Figure 9:
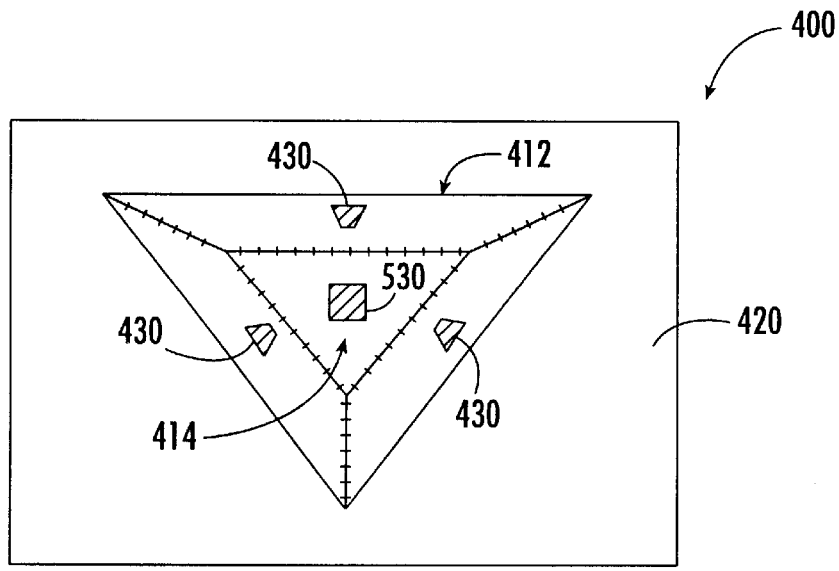
FIG. 9 is a top plan view of the microelectronic radiation detector of FIG. 6.

FIG. 9 shows a top plan view of the microelectronic radiation detector 400 of FIG. 6 with the addition of a base radiation sensor/emitter 530 fabricated on the substrate 420. The base sensor/emitter 530 is essentially concentrically aligned with the longitudinal axis 415 (FIG. 6) of the cavity 414 of the frustum structure 412. This configuration may be particularly useful in providing secure laser communications using a laser device such as a vertical cavity surface emitting laser (VCSEL) for emitter 530. The laser emitter 530 can be pointed towards a similar laser communication system in which communications are desired using the bearing detection technique described above. Transmission and reception could then occur with the sensor 530 centered at the peak of the incident beam. Any attempt at intercepting the beam would be detected as an interruption in transmission caused by the divergence or deflection of the beam as detected by the detectors 430.

The laser communications device of FIG. 9 can be coupled with a fast aiming mechanism such as UMR160+VP/MTM/SL20A+PP 5-axis precision positioner from Newport Corporation, Irvine, Calif. U.S.A., in order to provide secure point-to-point communications between moving vehicles. Thus, air-to-air, air-to-ground, or ship-to-ship secure communications can be provided by maintaining the required alignment between communicating devices.

Figure 10:
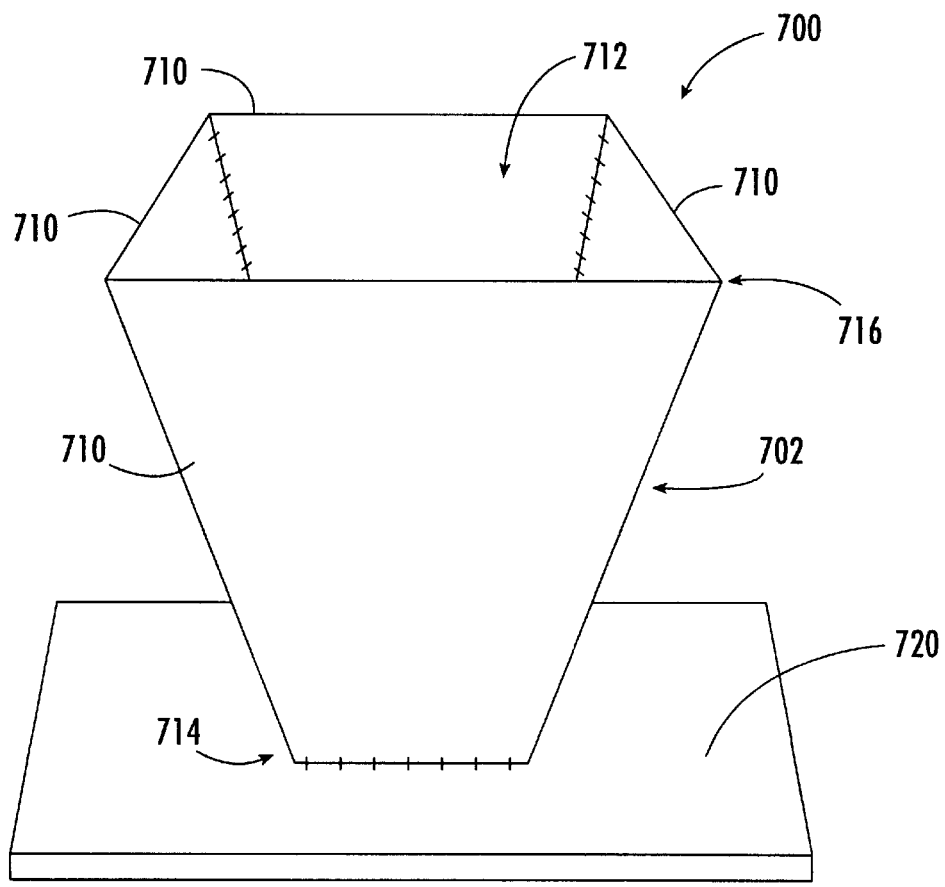
FIG. 10 is a perspective view of a microelectronic radiation detector in accordance with another embodiment of the present invention, wherein the microelectronic radiation detector includes four microelectronic substrates.

Referring to FIG. 10, a microelectronic radiation detector 700 in accordance with a second embodiment of the present invention is shown. The radiation detector 700 comprises a frustum structure 702 including four substantially identical microelectronic substrates 710. The microelectronic substrates 710 have a trapezoidal shape, and when interconnected at their edges as shown in FIG. 10, define a cavity 712 with a first opening 714 of a first area and a second opening 716 of a second area, wherein the first area is less than the second area. The frustum structure is mounted to a base 720 at the first opening 714, though it is understood that the frustum structure can be mounted to the base at the second opening 716. The microelectronic substrates 710 may have radiation sensors (not shown) formed at their respective centers, and/or a radiation sensor may be formed on the base 720 at the first opening. As shown in FIG. 10, the arched solder interconnects utilized to connect the frustum structure 702 to the base 720 can be configured to connect the outside surfaces of the respective microelectronic substrates 710 to the base 720, as shown.

Further to the four sided embodiment of FIG. 10, it will be understood that configurations of five or more sides are within the scope of the present invention, including the formation of circular or arcuate side portions. For example, by incorporating a sufficient number of microelectronic substrates, a frusta-conical shape may be achieved.

The four sided frustum structure 702 of the radiation detector 700 enables four detectors to be mounted on the respective substrates 710. This provides enhanced directional sensitivity. Further, this arrangement simplifies the trigonometric calculations required for bearing determination, thus decreasing the response time of the system.

The cavities 414, 712 of the radiation detectors 400 and 700, respectively, can be filled with an inert material such as epoxy, silicones or acrylic. By filling or potting the cavity, the mechanical integrity and durability of the radiation detectors 400, 700 are improved. Moreover, by selectively choosing a material that is substantially transparent to the frequency range of the radiation sensors and that has favorable transmission characteristics, the filling material can act as a lens for the radiation detectors which can modify operational characteristics such as the detector sensitivity or the field of view.

Figure 11:
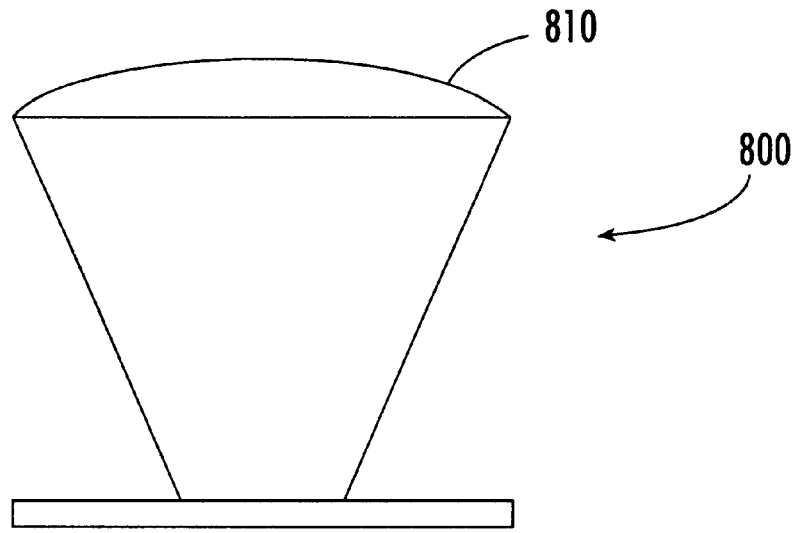
FIG. 11 is a side elevational view of the microelectronic radiation detector of FIG. 10, wherein the frustum structure is filled with an inert material that is formed into a convex lens.

For example, FIG. 11 shows the four sided microelectronic radiation detector 800, similar to the detector 700 shown in FIG. 10 and described in the accompanying text, which is filled with an inert material that forms a convex lens 810. The lens 810 can be formed by machining, molding, and/or polishing. The convex lens 810 may increase the field of view of the radiation detector 800, which may be advantagous for coarse bearing detection, fast moving emitters, or to diffuse incident radiation.

Figure 12:
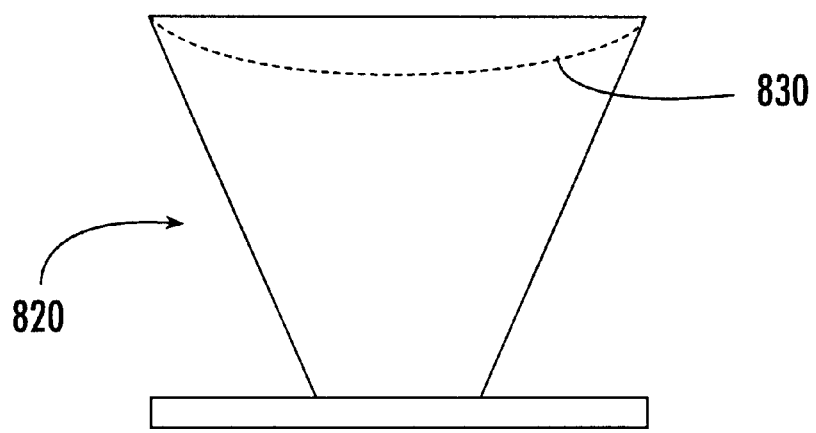
FIG. 12 is a side elevational view of the microelectronic radiation detector of FIG. 10, wherein the frustum structure is filled with an inert material that is formed into a concave lens.

In FIG. 12, a four sided microelectronic radiation detector 820, similar to the detector 700 shown in FIG. 10 and described in the accompanying text, is filled with an inert material that forms a concave lens 830 as illustrated in phantom lines. The lens 830 can be formed by machining, molding, and/or polishing. The concave lens may 830 narrow the field of view, and the detection zone or footprint of the radiation detector 820. This may be particularly advantageous in numerous applications such as in fine bearing detection or secure communication. In addition to the convex lens and concave lens configurations of FIGS. 1 and 12, respectively, other lens options which are known to those skilled in the art may be utilized such as a molded fresnel lens.

Figure 13:
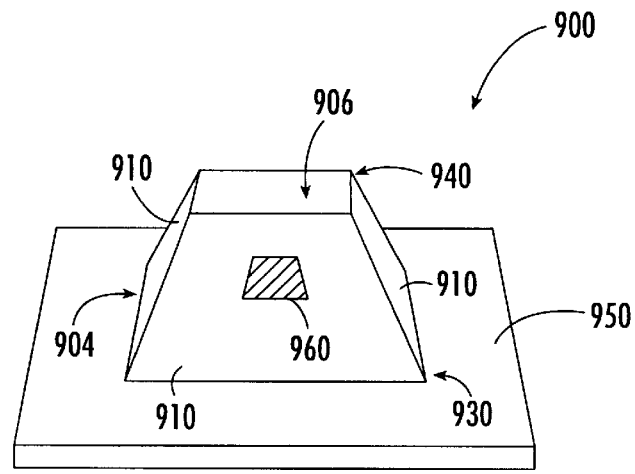
FIG. 13 is a perspective view of a microelectronic radiation detector such as the one of FIG. 10, wherein the frustum structure is inverted.

Referring now to FIG. 13, the microelectronic radiation detector 900 in accordance with a third embodiment of the present invention is shown. The radiation detector 900 comprises a frustum structure 904 having three or more microelectronic substrates 910, much like the radiation detector 400 of FIG. 9. The frustum structure 904 includes a cavity 906 with a first opening 930 of a first area and a second opening 940 of a second area, wherein the first area is greater than the second area. Unlike the radiation detector 700 of FIG. 9, the frustum structure 904 is inverted and mounted with the first opening adjacent to a base 950. The microelectronic substrate 900 has one or more radiation sensors 960 mounted on the outside surfaces of each of the microelectronic substrates 910. As with the previous embodiments described herein, the radiation detector 900 can be filled with an inert material to add mechanical strength or to improved sensor performance. Also, the radiation sensor can be mounted on inside or outside surfaces of the substrates 910, and or to the base 950, as described above with regard to the first and second embodiments. If the substrates were transparent to the radiation of interest, then placing the detectors inside the frustum may protect them from the environment. In addition, the substrates 910 could act as a filter against unwanted wavelengths.

Figure 14:
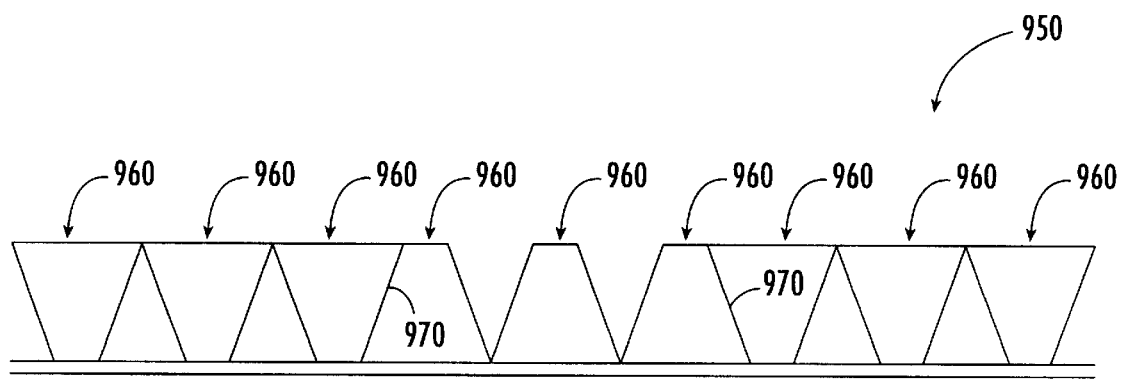
FIG. 14 is an illustration of an array of microelectronic radiation detectors in accordance with the present invention.

The geometric configurations of the microelectronic radiation detectors can be chosen to allow for the nesting of detectors in a mating relationship. Thus, an array of detectors can be fabricated with a relatively small pitch, thereby maximizing the packaging density of the detectors. As shown in FIG. 14, an array 950 of two or more radiation detectors 960 can be formed by fabricating detectors 960 side-by-side in a contiguous fashion. Where adjacent radiation detectors 960 have flush side substrates, the adjacent radiation detectors may share a common side substrate, such as substrates 970. The radiation sensors utilized in the respective radiators detectors 960 may have the same or different wavelength sensitivity as described above. This may be particularly advantageous in numerous applications such as imaging, phased arrays, and to improve sensitivity to low level signals.

An alternative nesting configuration is to mount a plurality of radiator detectors 700 (FIG. 10) in a coaxial relationship so that adjacent radiation detectors are nested within respective cavities 712. This may provide advantageous packaging efficiencies, especial with regard to lateral space.

Figure 15:
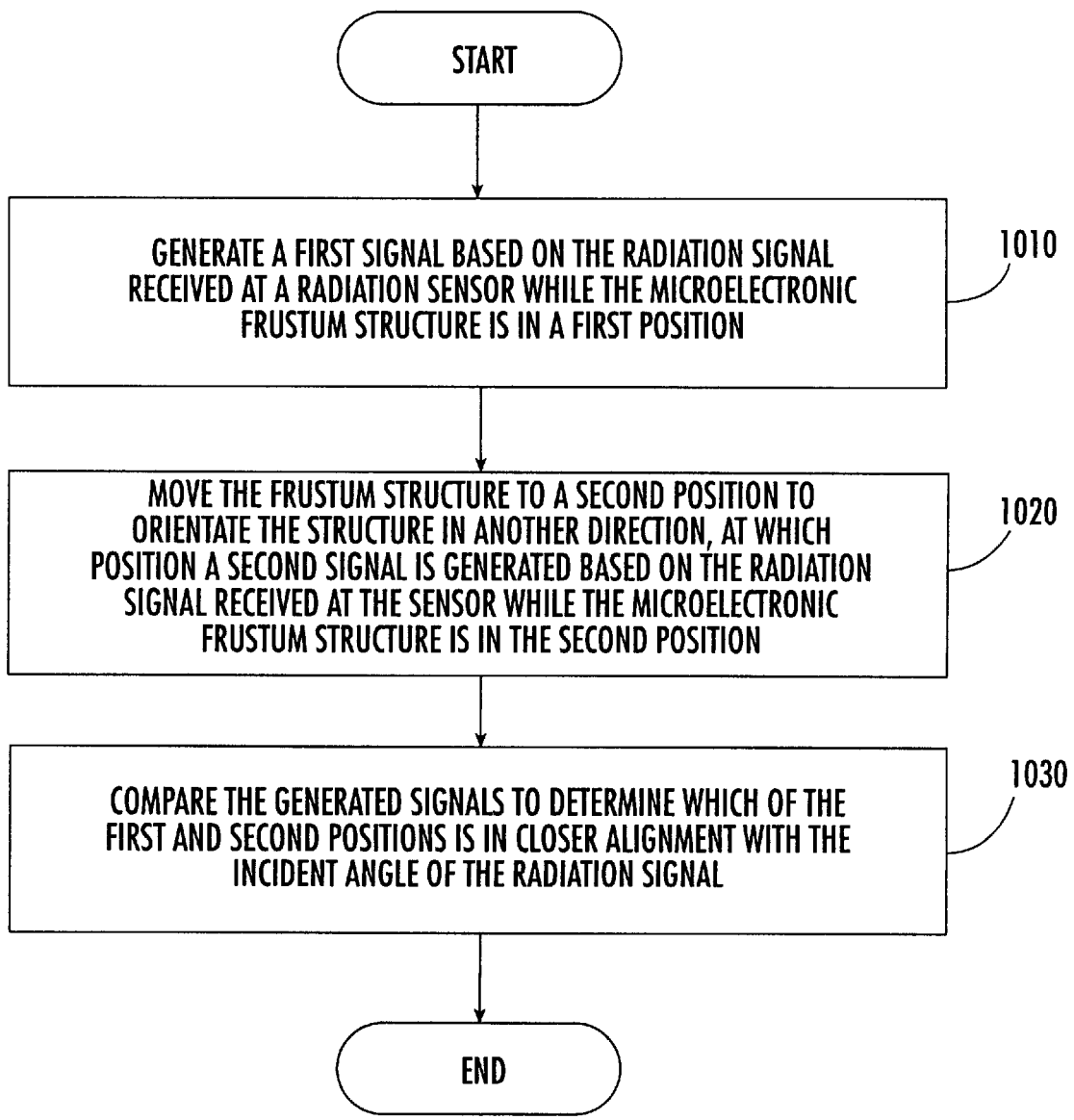
FIG. 15 is a cross-sectional view of a microelectronic radiation detector in accordance with the present invention, wherein the microelectronic substrates have generally curved interior surfaces.
Figure 16:
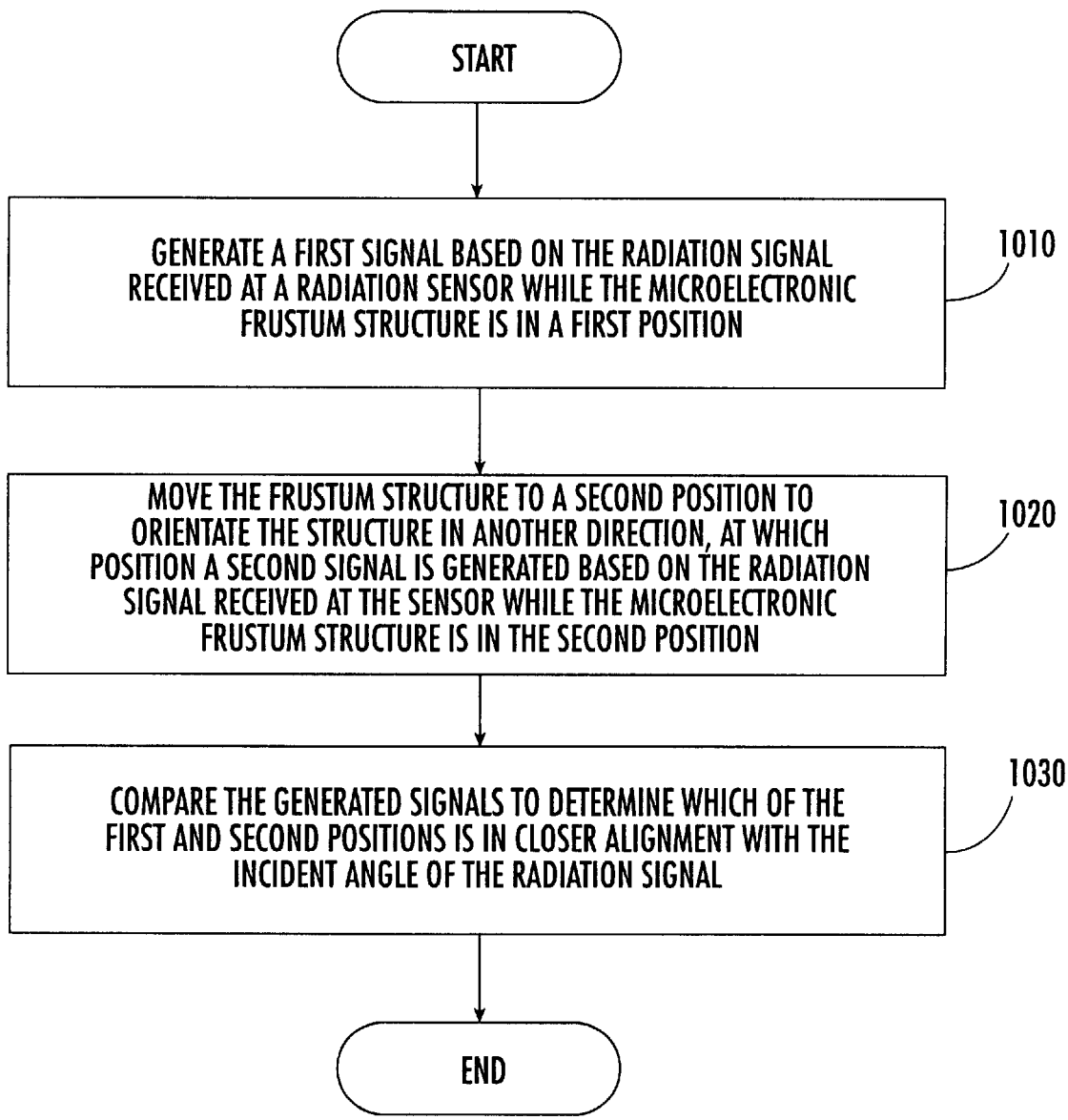
FIG. 16 is a flowchart of the operation of a microelectronic radiation detector in accordance with the present invention.

Referring to FIG. 15, a cross-sectional view of a radiation detector 980 is shown. The radiation detector 980 comprises a four-sided frustum structure, as described above, wherein the respective side substrates have generally curved interior surfaces 982 forming an arcuate cavity 984. A radiation detector/emitter 986 is shown at an approximated vertex of the frustum structure for illustrative purpose. It will be understood by those skilled in the art the radiation detectors/emitter 986 can also be fabricated on the sides forming the frustum structure.

Such a structure can be fabricated by a variety of well known methods such as molding, machining or etching. For example, using known injection molding technology, a negative form having the desired shape of a side component of the frustum structure can be formed. Wires can be prestamped to the appropriate length with pads at each end. One end of each wire may be associated with a detector/emitter and the other end may be associated with a solder bump pad and include an enlarged width portion and an elongated portion. The prestamped wire can be placed in the mold so as to run along the face of the mold and may be held in place by preformed groves or clamps associated with the mold. The plastic forming the side component can be injected into the sealed mold. A preferred plastic may be liquid crystal polymer. Once the plastic has set, the side component can be removed from the mold and connected to other side components utilizing the arched solder interconnect technique described herein before to form the radiation detector 980. The radiation detector 980 may provide improved spatial selectivity and sensitivity.

III. Operation

For purposes of describing the operation of an embodiment of the present invention, reference will be made to the radiation detector 400 illustrated in FIG. 9. A method of operation of the radiation detector 400 is provided in the flowchart of FIG. 14. Specifically, the radiation detector 400 in accordance with the present invention can be used to determine the incident angle of a radiation signal by generating a first signal based on the radiation signal received at a radiation sensor of the detector 400 while the microelectronic frustum structure is in a first position, as indicated by block 1010. If there is more than one radiation sensor associated with the detector 400, then additional signals can be generated based on the radiation signal received at each respective radiation sensor. The frustum structure is then moved to a second position to orient the microelectronic frustum structure in another direction, at which position a second signal is generated based on the radiation signal received at the sensor while the microelectronic frustum structure is in the second position, as indicated by block 1020. Again, additional signals can be generated for each additional radiation sensor associated with the detector 400 based on the radiation signal at each respective radiation sensor while the microelectronic frustum structure is in the first position. The signals that were generated are then compared at block 1040 to determine which of the first and second positions is in closer alignment with the incident angle of the radiation signal. The steps of generating the signals and comparing the signal can be performed by a discrete circuit component such as circuit component 450 fabricated on base 420 (FIG. 6).

In the drawings and specification, there have been disclosed typical preferred embodiments of the invention and, although specific terms are employed, they are used in a generic and descriptive sense only and not for purposes of limitation, the scope of the invention being set forth in the following claims.

Wherefore, the following is claimed:

1. A microelectronic structure, comprising:
  a multi-surface structure including at least a first microelectronic substrate and a second microelectronic substrate, wherein each substrate is connected to an adjacent microelectronic substrate to define a cavity with a first aperture having a first opening of a first area and a second aperture having a second opening of a second area, and wherein said first area is smaller than said second area;
  a base to which said multi-surface structure is mounted proximate said first aperture; and
  a radiation detector on a surface of at least one of said microelectronic substrates.

2. The microelectronic structure of claim 1, wherein said microelectronic substrates are interconnected by arched solder interconnects.

3. The microelectronic structure of claim 1, wherein said multi-surface structure is connected to said base by arched solder interconnects.

4. The microelectronic structure of claim 3, wherein said arched solder interconnects are attached to inside surfaces of said microelectronic substrates.

5. The microelectronic structure of claim 3, wherein said arched solder interconnects are attached to outside surfaces of said microelectronic substrates.

6. The microelectronic structure of claim 1, further comprising a radiation detector mounted on said base proximate said first aperture of said multi-surface structure.

7. The microelectronic structure of claim 1, further comprising means for moving said base to selectively orient said multi-surface structure.

8. The microelectronic structure of claim 1, wherein said multi-surface structure further comprises a third microelectronic substrate having at least two opposing edges, and wherein said third microelectronic substrate is connected at said two opposing edges with two of said first and second microelectronic substrates.

9. The microelectronic structure of claim 1, wherein an edge of at least one of said microelectronic substrates is connected to another of said microelectronic substrates.

10. The microelectronic substrate of claim 9, wherein said edge is beveled.

11. The microelectronic structure of claim 1, wherein said microelectronic substrates are trapezoids.

12. The microelectronic structure of claim 1, wherein respective edges of each said microelectronic substrate are connected to a corresponding edge of adjacent said microelectronic substrates.

13. The microelectronic structure of claim 1, wherein said microelectronic substrates are substantially equal in corresponding edge lengths.

14. The microelectronic structure of claim 1, wherein each of said microelectronic substrates include an inside surface that is generally planar.

15. The microelectronic structure of claim 1, wherein one of said microelectronic substrates includes an inside surface that is generally curved.

16. The microelectronic structure of claim 1, wherein said detector is mounted on an inside surface of said one of said microelectronic substrates.

17. The microelectronic structure of claim 1, wherein said detector is mounted on an outside surface of said one of said microelectronic substrates.

18. The microelectronic structure of claim 1, wherein said cavity is substantially filled with an inert material.

19. The microelectronic structure of claim 18, wherein said inert material is acrylic.

20. The microelectronic structure of claim 18, wherein said inert material is epoxy.

21. The microelectronic structure of claim 18, wherein said inert material is configured at said second aperture to form a convex lens.

22. The microelectronic structure of claim 18, wherein said inert material is configured at said second aperture to form a concave lens.

23. A microelectronic structure, comprising:
a frustum structure including at least a first microelectronic substrate, a second microelectronic substrate and a third microelectronic substrate forming the sides thereof and defining a longitudinal opening therethrough; and
a radiation detector on a surface of at least one of said microelectronic substrates.

24. The microelectronic structure of claim 23, wherein said frustum structure defines a first opening opposite a second opening, wherein said first opening has a smaller area than said second opening, and further comprising a base to which said frustum structure is mounted at said first opening.

25. The microelectronic structure of claim 24, further comprising a second radiation detector mounted on said base.

26. The microelectronic structure of claim 24, wherein said second radiation detector is concentrically aligned with said longitudinal opening of said frustum structure.

27. The microelectronic structure of claim 24, further comprising means for moving said base to selectively orient said frustum structure.

28. The microelectronic structure of claim 24, wherein said frustum structure is connected to said base by arched solder interconnects.

29. The microelectronic structure of claim 24, wherein said frustum structure further comprising a fourth microelectronic substrate interconnected at opposing edges with two of said first, second and third microelectronic substrates.

30. The microelectronic structure of claim 23, wherein said microelectronic substrates are interconnected by arched solder interconnects.

31. The microelectronic structure of claim 23, wherein said arched solder interconnects are attached to inside surfaces of said microelectronic substrates.

32. The microelectronic structure of claim 23, wherein said arched solder interconnects are attached to outside surfaces of said microelectronic substrates.

33. The microelectronic structure of claim 23, wherein said detector is mounted to an outside surface of said frustum structure.

34. The microelectronic structure of claim 23, wherein said detector is mounted to an inside surface of said frustum structure.

35. A microelectronic structure, comprising:
a frustum structure including at least a first microelectronic substrate, a second microelectronic substrate and a third microelectronic substrate forming respective sides of said frustum structure and defining a longitudinal opening therethrough, said frustum structure defines a first opening opposite a second opening, and wherein said first opening has a smaller area than said second opening;
a base to which said frustum structure is mounted; and
a radiation detector mounted on said base.

36. The microelectronic structure of claim 35, further comprising a second radiation detector on a surface of one of said microelectronic substrates.

37. The microelectronic structure of claim 35, wherein said frustum structure is connected to said base by arched solder interconnects.

38. The microelectronic structure of claim 35, wherein said microelectronic substrates are interconnected by arched solder interconnects.

39. The microelectronic structure of claim 35, wherein said radiation detector is centrally aligned with said first opening of said frustum structure.

40. The microelectronic structure of claim 35, wherein said opening is substantially filled with an inert material.

41. The microelectronic structure of claim 40, wherein said inert material is configured at said second aperture to form a convex lens.

42. The microelectronic structure of claim 40, wherein said inert material is configured at said second aperture to form a concave lens.

43. The microelectronic structure of claim 40, wherein said frustum is mounted to said base at said first opening.

44. The microelectronic structure of claim 40, wherein said frustum is mounted to said base at said second opening.

45. A method for determining an incident angle of a radiation signal utilizing a microelectronic frustum structure having a plurality of sides that define a longitudinal opening therethrough having a first end and a second end, wherein the first end has a smaller area than the second end, and the microelectronic frustum structure being mounted to a base at the first end thereof, said method comprising the steps of:

generating a first signal based on the radiation signal received at a first radiation detector located on the base while the microelectronic frustum structure is in a first position;

moving the base to a second position to orient the microelectronic frustum structure in another direction;

generating a second signal based on the radiation signal received at the first radiation detector while the microelectronic frustum structure is in the second position; and comparing the first and second signals to determine which of the first and second positions is in closer alignment with the incident angle of the radiation signal.

46. The method of claim 45, wherein the step of generating a first signal comprises selecting a signal from a plurality of first radiation detectors located on the base.

47. The method of claim 45, further comprising the steps of:

generating a third signal based on the radiation signal received at a second radiation detector located on an inside surface of one of the plurality of sides of the microelectronic frustum structure while the microelectronic frustum structure is in the first position; and combining the first and third signals to determine the incident angle of the radiation signal.

48. The method of claim 47, further comprising the steps of:

generating a fourth signal by a second microelectronic frustum structure based on the radiation signal received at a third radiation detector located on a second inside surface of one of a plurality of sides of the second microelectronic frustum structure; and calculating the range to a source of the radiation signal utilizing the fourth signal and the first and third signals.

49. A method for determining an incident angle of a radiation signal utilizing a microelectronic structure that forms a cavity having a side portion and a base portion said method comprising the steps of:

generating a first signal based on a first radiation signal received at a first radiation detector located on the base portion while the microelectronic structure is in a first position;

moving the microelectronic structure to a second position to orient the microelectronic structure in another direction;

generating a second signal based on a second radiation signal received at the first radiation detector while the microelectronic structure is in the second position; and comparing the first and second signals to determine which of the first and second positions is in closer alignment with the incident angle of the radiation signal.

50. The method of claim 49, wherein said step of generating the first signal includes the step of receiving the first radiation signal in a concave base portion.

51. The method of claim 49, further comprising the steps of:

generating a third signal based on a third radiation signal received at a second radiation detector located on an inside surface of one of the side portion of the microelectronic structure while the microelectronic structure is in the first position; and combining the first and third signals to determine the incident angle of the radiation signal.

52. The method of claim 51, wherein said step of generating the third signal includes the step of receiving the third radiation signal in a annular side portion.

53. The method of claim 51, further comprising the steps of:

generating a fourth signal based on the radiation signal received at a third radiation detector located on the inside surface of the side portion of the microelectronic structure; and combining the fourth signal with the first and third signals to determine the incident angle of the radiation signal.

54. The method of claim 50, wherein the step of generating a first signal comprises selecting a signal from a plurality of said first radiation detectors located on the base portion.

55. A method of fabricating a microelectronic signaling device, comprising the steps of:

interconnecting adjacent edges of a plurality of microelectronic substrates via arched solder interconnects to form a frustum structure defining a cavity having first and second openings;

mounting the frustum structure to a base; and fabricating a radiation detector adjacent the base at the first opening of the frustum structure.

56. The method of claim 55, wherein the step of mounting the frustum structure to the base includes the step of mounting the frustum structure to the base utilizing arched solder interconnects.

57. The method of claim 55, further comprising the step of filling the cavity of the frustum structure with an inert material.

58. The method of claim 57, further comprising the step of forming a convex lens in the inert material.

59. The method of claim 57, further comprising the step of forming a concave lens in the inert material.

60. The method of claim 55, wherein the step of interconnecting edges of the microelectronic substrates includes forming arched solder interconnects on outside surfaces of the microelectronic substrates.

61. The method of claim 55, wherein the step of interconnecting edges of the microelectronic substrates includes forming arched solder interconnects on inside surfaces of the microelectronic substrates.

* * * * *